United States Patent [19]

Akazawa

[11] Patent Number: 5,218,218
[45] Date of Patent: Jun. 8, 1993

[54] SEMICONDUCTOR DEVICE AND MANUFACTURING METHOD THEREOF

[75] Inventor: Moriaki Akazawa, Hyogo, Japan

[73] Assignee: Mitsubishi Denki Kabushiki Kaisha, Tokyo, Japan

[21] Appl. No.: 895,158

[22] Filed: Jun. 5, 1992

Related U.S. Application Data

[63] Continuation of Ser. No. 647,012, Jan. 29, 1991, abandoned.

[30] Foreign Application Priority Data

Feb. 1, 1990 [JP] Japan .................................. 2-23898

[51] Int. Cl.⁵ ........................ H01L 29/68; H01L 29/10
[52] U.S. Cl. .................................. 257/302; 257/329
[58] Field of Search ................ 357/23.6, 55, 51, 23.4, 357/54, 59

[56] References Cited

U.S. PATENT DOCUMENTS

| | | | |
|---|---|---|---|
| 4,713,678 | 12/1987 | Womack et al. | 357/23.6 |
| 4,914,739 | 4/1990 | Malhi | 357/23.6 |
| 4,939,104 | 7/1990 | Pollack et al. | 357/23.6 |
| 4,967,247 | 10/1990 | Kaga et al. | 357/23.6 |
| 4,977,436 | 12/1990 | Tsuchiya et al. | 357/23.6 |
| 4,989,055 | 1/1991 | Redwine | 357/23.6 |
| 5,006,909 | 4/1991 | Kosa | 357/23.6 |

FOREIGN PATENT DOCUMENTS

3841588A1 12/1988 Fed. Rep. of Germany.
1-25465 1/1989 Japan .................................. 357/23.6

OTHER PUBLICATIONS

IBM Technical Disclosure Bulletin, "New Vertical Stacked-Transistor Substrate-Plate Trench Cell and Fabrication Process Therefor", vol. 32, No. 3B, Aug., 1989, pp. 177-182.

"A Trench Transistor Cross-Point Dram Cell", *IEDM* 85, by W. F. Richardson et al, 1985, pp. 714-717.

*Primary Examiner*—Mark V. Prenty
*Attorney, Agent, or Firm*—Lowe, Price, LeBlanc & Becker

[57] ABSTRACT

A semiconductor device includes a second insulator layer (12), a first conductor layer (13) and a second insulator layer (14) stacked in this order on a semiconductor substrate (11), and a trench (15) formed to penetrate the stacked triple layer and extend into the semiconductor substrate. A capacitor is formed at a portion of the trench located in the semiconductor substrate. A transistor is formed directly on this capacitor. The capacitor has one electrode formed of the semiconductor substrate and the other electrode formed of a second conductor layer (18) formed in the trench to open a dielectric film (17). The transistor includes a gate electrode formed of the first conductor layer and source/drain regions (20, 21) of a second conductivity type distributed in the vicinity of the first and second insulator layers in an active layer (19) filling the trench. The drain and source regions of the transistor are formed by thermally diffusing impurities included in the first and second insulator layers into the active layer. Since a region to be added only for isolation is unnecessary in this semiconductor device and a manufacture method thereof, a memory cell area can be reduced, resulting in higher integration of the device.

8 Claims, 8 Drawing Sheets

SEMICONDUCTOR DEVICE AND MANUFACTURING METHOD THEREOF

This application is a continuation of application Ser. No. 07/647,012 filed Jan. 29, 1991 and now abandoned.

BACKGROUND OF THE INVENTION

1. Field of the Invention

The present invention relates generally to semiconductor devices and manufacturing methods thereof and, more particularly, to structure of a dynamic memory device in which a so-called trench capacitor is employed as a capacitor, and a vertical MOS field effect transistor is formed as a transistor, and a method of manufacturing such a dynamic memory device.

2. Description of the Background Art

Recently, a higher degree of integration of semiconductor devices has been required, and accordingly, it becomes the greatest technical assignment to reduce the area of a memory cell storing 1-bit information in the semiconductor devices. In dynamic memory devices, the respective areas of a capacitor, drain and isolation region are required to be as small as possible. To satisfy this requirement, a dynamic memory device has conventionally been proposed in which a trench capacitor is adopted as a capacitor, a MOS field effect transistor is formed on a side surface of the same trench forming the capacitor therein, and an oxide film is utilized for an isolation region (See, e.g., IEDM85, pp.714-717.)

FIGS. 1A and 1B show one example of a conventional dynamic memory device. This dynamic memory device includes a p type epitaxial layer 2 formed on a p type silicon substrate 1, and a trench 3 formed in this p type epitaxial layer 2 and extending into silicon substrate 1. A second conductor layer 5 is formed at a portion of trench 3 located in silicon substrate 1, with a dielectric film 4 interposed therebetween. A first conductor layer 7 serving as a word line is formed at a portion of trench 3 located in epitaxial film 2, with a gate insulation film 6 interposed therebetween. An n type drain 8 serving as a bit line is formed on a surface of epitaxial layer 2 on peripheries of an opening of trench 3. Silicon substrate 1 and second conductor layer 5 interposing dielectric film 4 therebetween constitute a cell plate of a trench capacitor and a storage node, respectively.

A manufacture process of this dynamic memory device will now be described.

First, a silicon epitaxial layer 2 including p type impurities in a lower density than that of p type impurities included in a silicon substrate 1 is formed on silicon substrate 1. Only a portion of a surface of this silicon epitaxial layer which is to be isolated is selectively oxidized, to form an oxide film 9. Then, the resultant film is ion-implanted with n type impurities such as arsenic or the like and is also subjected to a thermal processing, so that drain 8 serving as a bit line is formed on the surface of silicon epitaxial layer 2.

Next, a hole extending from the surface of silicon epitaxial layer 2 to semiconductor substrate 1 is formed at a predetermined position, and a dielectric layer 4 such as a silicon oxide film, silicon nitride film or the like and a second conductor layer 5 formed of polysilicon and including n type impurities such as phosphorus or the like fill the hole halfway in silicon epitaxial layer 2. At this time, however, an upper end of dielectric film 4 is set to be lower than that of second conductor layer 5 so that second conductor layer 5 may become conductive with silicon epitaxial layer 2.

Then, a gate insulation film 6 is formed on the surface of silicon epitaxial layer 2 (including also a surface of drain 8), and then a first conductor layer 7 formed of polysilicon including phosphorus or the like is deposited thereon by a CVD (Chemical Vapor Deposition) or the like. The deposited layer is patterned to form a word line.

A memory cell having this structure constitutes a MOS field effect transistor including first conductor layer 7 as a gate electrode, drain 8 as a drain region and an upper portion of second conductor layer 5 as a source region. Accordingly, first conductor layer 7 serves as a word line for an input/output, drain 8 as a bit line for an input/output, and second conductor layer 5 as a storage node (a capacitor electrode), so that the structure thus formed operates as a memory cell like a normal dynamic memory device. In a semiconductor device having this structure, major portions of the MOS transistor, i.e., source/drain regions, a channel region and the like are formed outside the trench. More specifically, since an active layer of the MOS transistor is formed on the substrate side, an isolation between elements such as by an oxide film is required. In case where an isolation width decreases forcibly in order to reduce the area of an isolation region occupying the area of the memory cell, the capability and reliability of the transistor as an element might considerably deteriorate due to deterioration of isolation characteristics. To maintain excellent isolation characteristics, the proportion of the isolation region area to the area of the memory cell requires approximately 50% of the memory cell area. That is, the area approximately half the memory cell area should be used for isolation alone, resulting in the disadvantage that there is a limitation in reduction of the isolation region area.

SUMMARY OF THE INVENTION

An object of the present invention is to provide a semiconductor device including a dynamic memory device in which the area of a memory cell can be reduced, and the degree of integration of the memory cell can be enhanced by eliminating requirements of particularly providing means for isolation alone, and a method of manufacturing such a semiconductor device.

In a semiconductor device in accordance with the present invention, a first insulator layer, a first conductor layer and a second insulator layer are stacked in this order on a semiconductor substrate. This semiconductor device includes a trench formed to penetrate this stacked triple layer and extend into the semiconductor substrate. A capacitor is formed at a portion of this trench located in the semiconductor substrate. A transistor is formed directly on this capacitor. The capacitor has one electrode formed of the semiconductor substrate and the other electrode formed of a second conductor layer formed on a side surface and a bottom surface of the trench located in the semiconductor substrate, with a dielectric interposed therebetween. The transistor has a gate electrode formed of the first conductor layer, a gate insulation film formed of an insulator film formed on an inner circumferential surface of the trench located at the position of the first conductor layer, and source/drain regions formed in an active layer buried in the trench and distributed only near the first and second insulator layers so as to interpose the gate insulation film between the source/drain regions.

In this semiconductor device, since the transistor is formed vertically, and the source/drain regions are formed inside the trench, the vertically formed transistor requires a smaller area occupied by a memory cell than that of a lateral transistor having the same capability. Further, the present vertical transistor does not require means which is to be added particularly for isolation alone. Thus, an extremely small memory cell area can be achieved. The semiconductor device having the abovedescribed structure is manufactured by the following method. A first insulator layer, a first conductor layer having a first conductivity type and a second insulator layer are formed in turn on a semiconductor substrate. A hole penetrating the second insulator layer, the first conductor layer and the first insulator layer and extending into the semiconductor substrate is formed normally to a main surface of the semiconductor substrate, so as to form a trench. The second insulator layer and the first conductor layer are then patterned in a predetermined pattern. Impurities are thereafter implanted onto a side surface of the trench, so that a region on the side surface of the trench located in the semiconductor substrate becomes electrically conductive. Then, a dielectric film and a second conductor layer are formed in turn in the respective regions on the side surface and a bottom surface of the trench located in the semiconductor substrate. A gate insulation film is thereafter formed on the side surface of the trench located at the position of the first conductor layer, and an active region is further formed in a region located higher than the semiconductor substrate in the trench. Then, impurities of a second conductivity type are diffused in two opposite regions formed on an outer circumference of the active region and opposing to each other with the gate insulation film interposed therebetween, thereby to form source/drain regions.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A description will now be given of one embodiment of the present invention with reference to the figures.

Figure 1A:
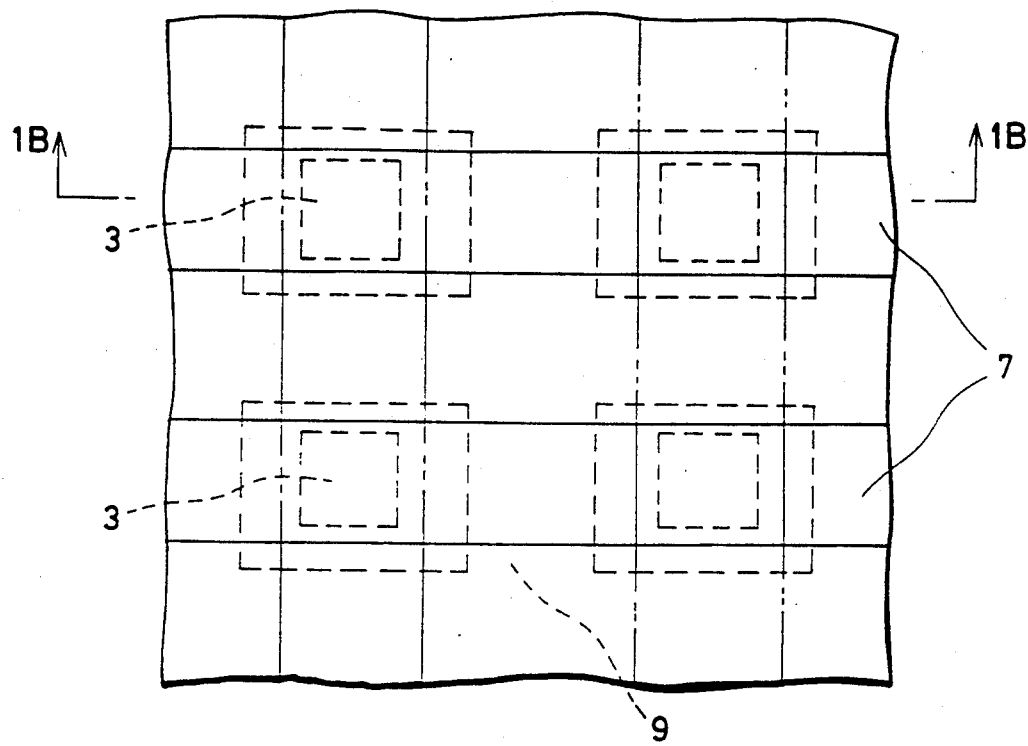
FIG. 1A is a plan view showing one example of a conventional trench dynamic memory device.
Figure 1B:
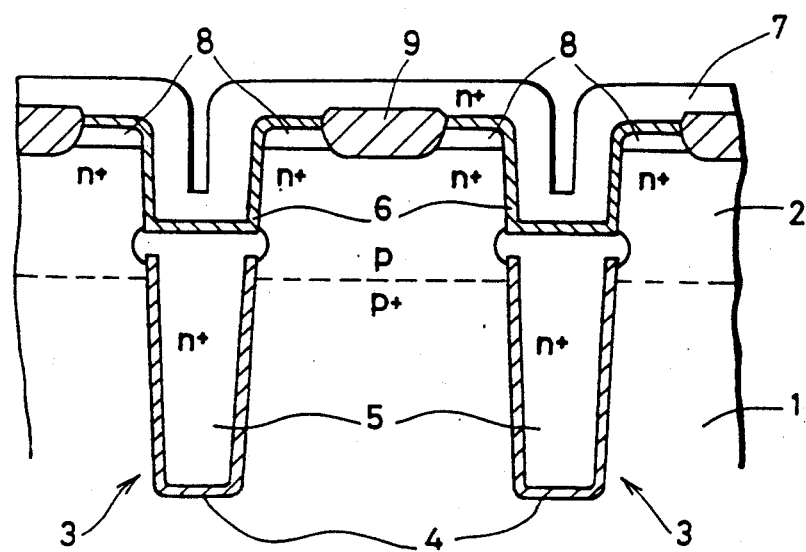
FIG. 1B is a cross-sectional view taken along the line 1B—1B of FIG. 1A.
Figure 2A:
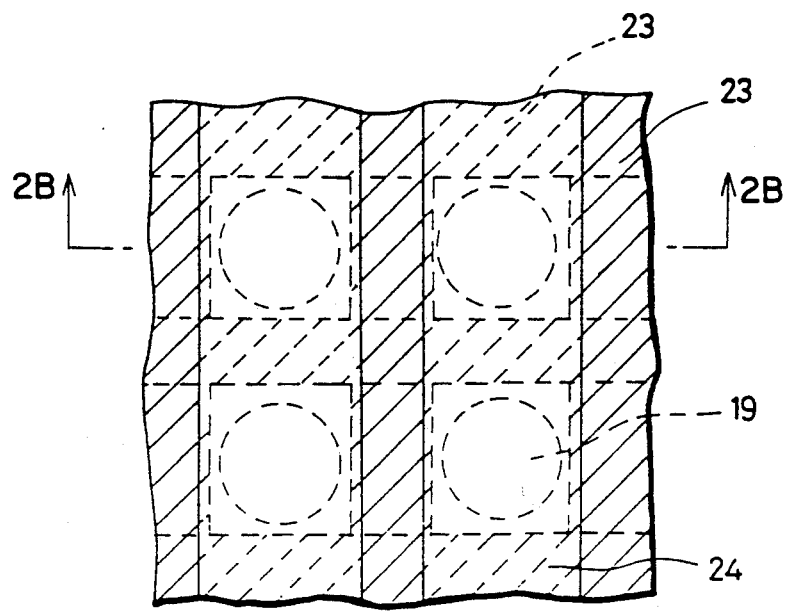
FIG. 2A is a plan view of a trench dynamic memory device according to one embodiment of the present invention.
Figure 2B:
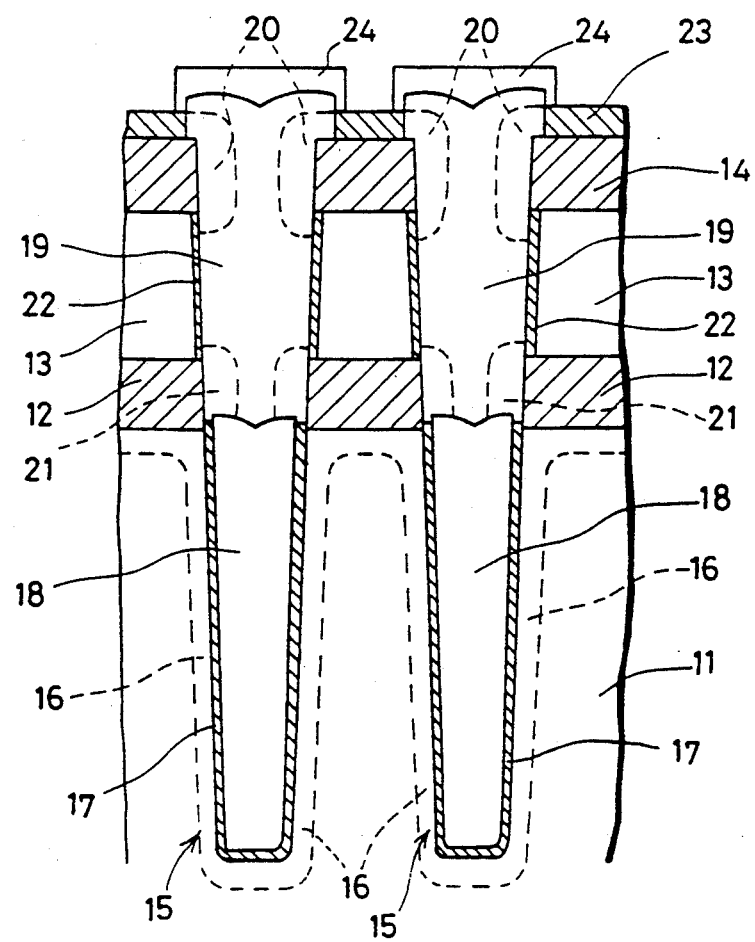
FIG. 2B is a cross-sectional view taken along the line 2B—2B of FIG. 2A.

FIGS. 2A and 2B show a plan view of a memory cell of a dynamic memory device according to one embodiment of the present invention and a cross-sectional structure of the dynamic memory device, respectively. In the memory cell of this embodiment, with reference to FIGS. 2A and 2B, a first insulator layer 12, a first conductor layer 13 and a second insulator layer 14 are stacked on a silicon substrate 11. First insulator layer 12 is formed such as of a silicon oxide film doped with approximately $10^{21}/cm^3$ of n type impurities such as phosphorus or the like and has a thickness of approximately 0.5 $\mu$m. First conductor layer 13 is formed of a polysilicon layer including approximately $7 \times 10^{20}/cm^3$ of n type impurities such as phosphorus or the like and has a thickness of approximately 1 $\mu$m. Second insulator layer 14 is formed such as of a silicon oxide film including approximately $10^{21}/cm^3$ of n type impurities such as arsenic or phosphorus and has a thickness of approximately 0.5 $\mu$m. Trenches 15 being semi-cylindrical holes of approximately 0.8 $\mu$m in diameter are formed in this stacked layer with a spacing of the trenches being 1.5–2.0 $\mu$m. A first impurity layer 16 doped with approximately $2 \times 10^{18}/cm^3$ of n type impurities such as phosphorus or the like is formed at the respective portions of a side surface and a bottom surface of each of trenches 15, which are located in a semiconductor substrate 11 and approximately 3 $\mu$m in depth. A dielectric film 17 of approximately 70 Å in thickness formed of a silicon nitride film or a silicon oxide film is deposited on an inner circumferential surface of trench 15 in those portions. A second conductor layer 18 formed such as of polysilicon including approximately $2 \times 10^{18}/cm^3$ of n type impurities such as arsenic or phosphorus is deposited on a surface of dielectric film 17. This second conductor layer 18 and first impurity layer 16 constitute a capacitor with dielectric film 17 interposed therebetween. That is, first impurity layer 16 serves as a cell plate of the memory cell, and second conductor layer 18 serves as a storage node. An active layer 19 including approximately $4 \times 10^{16}/cm^3$ of p type impurities such as boron or the like is deposited on second conductor layer 18. This active layer 19 is patterned so that an upper portion thereof may cover an opening of each trench. A drain region 20 in which n type impurities are diffused is formed in the upper portion of active layer 19, and a source region 21 is formed in a lower portion thereof. A gate insulation film 22 is formed in first conductor layer 13 located between drain and source regions 20 and 21.

A third conductor layer 24 formed of titanium nitride or doped polysilicon is formed as an interconnection on second insulator layer 14, with a third insulator layer 23 interposed therebetween. This third conductor layer 24 serves as a bit line.

Figure 3:
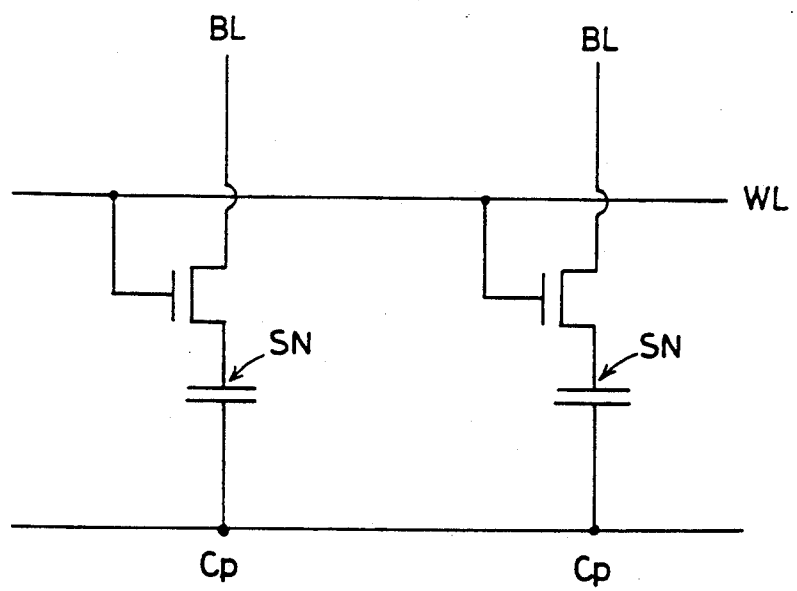
FIG. 3 is an equivalent circuit diagram of the dynamic memory device shown in FIGS. 2A and 2B.

In the foregoing structure, a MOS field effect transistor having its gate formed of first conductor layer 13 and a capacitor formed of second conductor layer 18, dielectric film 17 and first impurity layer 16 are formed in the direction of the depth of trench 15. Elements having the function shown in the equivalent circuit diagram of FIG. 3 are formed. In FIG. 3, a bit line BL corresponds to third conductor layer 24 of FIG. 2B; a word line WL corresponds to first conductor layer 13 of FIG. 2B; a storage node SN corresponds to second conductor layer 18 of FIG. 2B; and a cell plate CP corresponds to first impurity layer 16 of FIG. 2B.

A description will now be given of a manufacture process of the dynamic memory device structured as above.

Figure 4A:
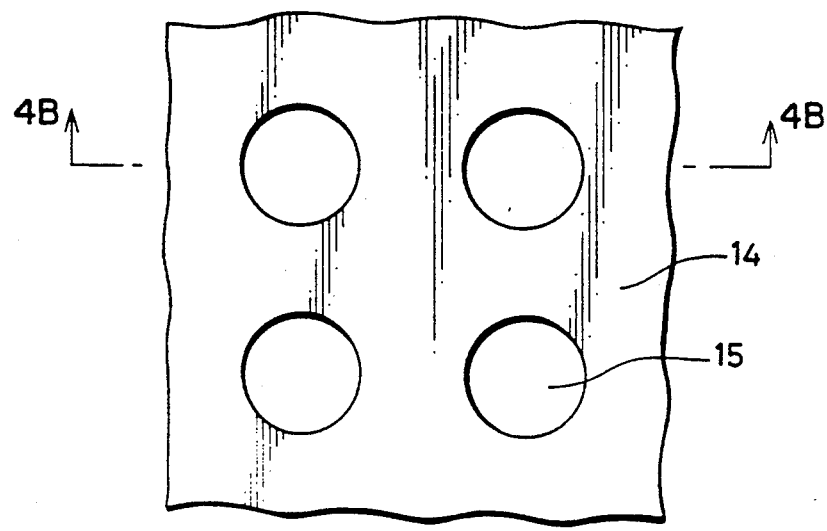
FIG. 4A is a plan view showing a first processing step of a principal manufacture process of the dynamic memory device according to the embodiment of the present invention.
Figure 4B:
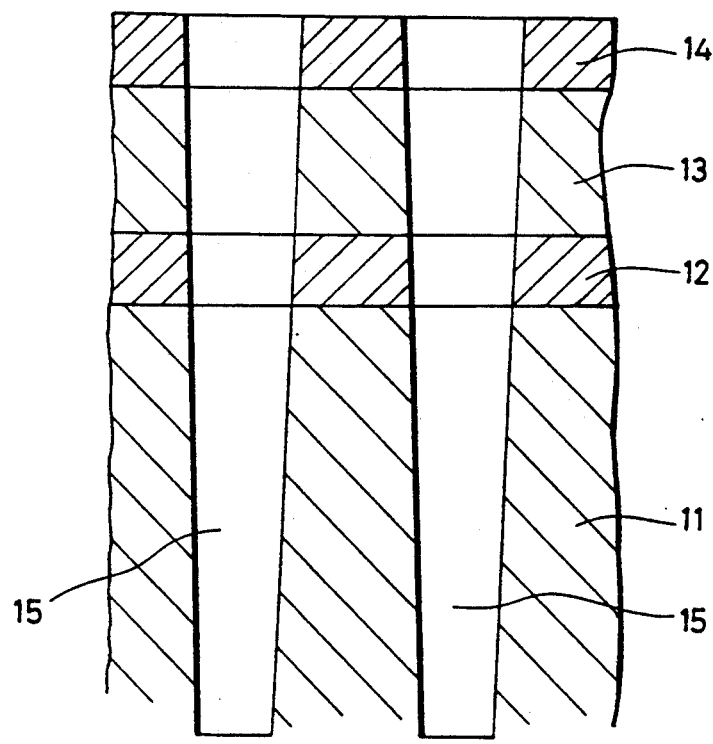
FIG. 4B is a cross-sectional view taken along the line 4B—4B of FIG. 4A.

First, a silicon oxide film including n type impurities such as arsenic or phosphorus is deposited to a thickness of approximately 0.5 $\mu$m and in an impurity concentration of approximately $10^{21}/cm^3$ on a silicon substrate 11 by a plasma CVD method or the like, thereby to form a first insulator layer 12. Then, polysilicon including n type impurities such as arsenic or phosphorus is deposited to a thickness of approximately 1 $\mu$m and in an impurity concentration of approximately $7\times10^{20}/cm^3$ on this first insulator layer 12 by also employing the plasma CVD method or the like, thereby to form a first conductor layer 13. A silicon oxide film including n type impurities such as arsenic or phosphorus is then deposited to a thickness of approximately 0.5 $\mu$m and in an impurity concentration of approximately $10^{21}/cm^3$ on first conductor layer 13, thereby to form a second insulator layer 14. Next, a plurality of semi-cylindrical trenches 15 are formed with a predetermined spacing to penetrate second insulator layer 14, first conductor layer 13 and first insulator layer 12 and in a depth of approximately 3.0 $\mu$m in silicon substrate 11 by employing a dry etching method. The resultant structure is shown in FIGS. 4A and 4B.

Figure 5A:
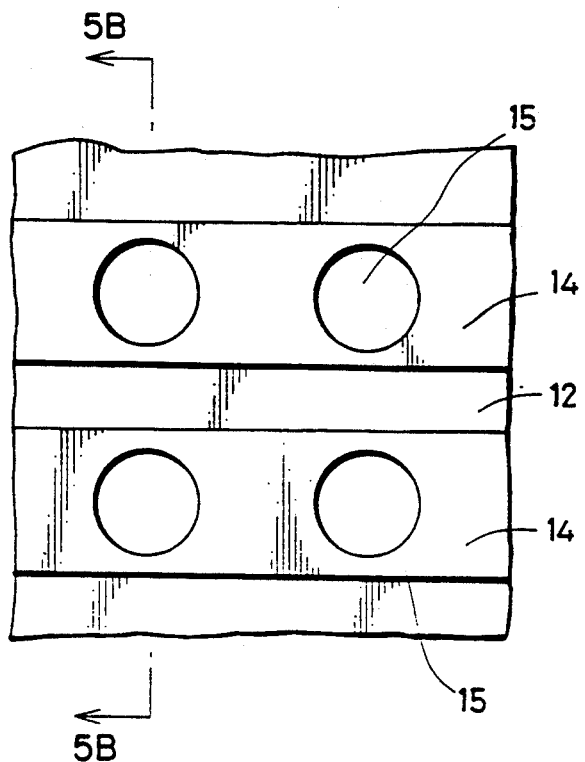
FIG. 5A is a plan view showing a second processing step of the principal manufacture process of the dynamic memory device according to the embodiment of the present invention.
Figure 5B:
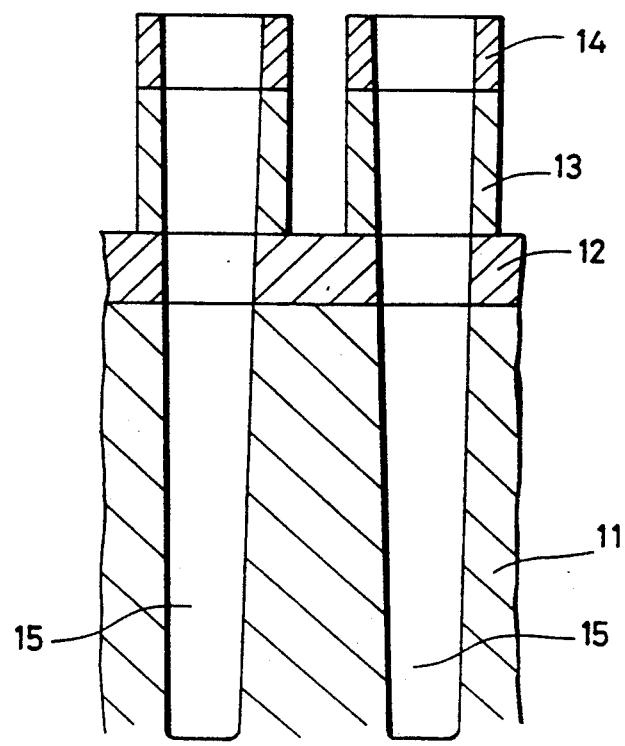
FIG. 5B is a cross-sectional view taken along the line 5B—5B of FIG. 5A.

A photoresist (not shown) is then patterned by photolithography in order to pattern first conductor layer 13 serving as a word line. Thereafter, only second insulator layer 14 and first conductor layer 13 are subject to dry etching, and a word line undergoes an interconnection processing. The resultant structure is shown in FIGS. 5A and 5B.

Figure 6A:
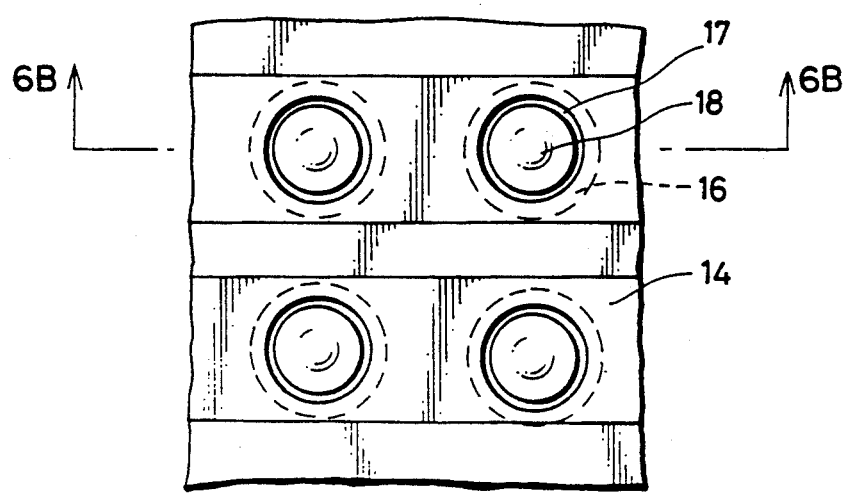
FIG. 6A is a plan view showing a third processing step of the principal manufacture process of the dynamic memory device according to the embodiment of the present invention.
Figure 6B:
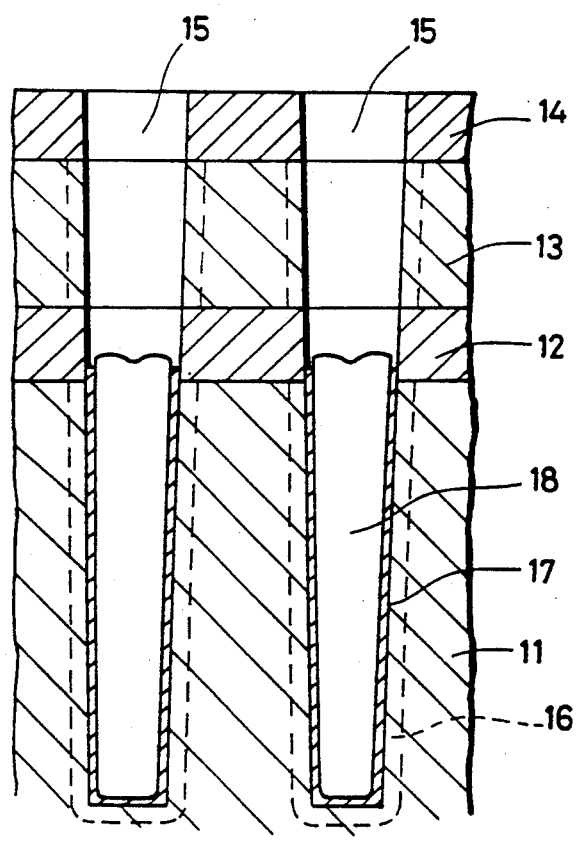
FIG. 6B is a cross-sectional view taken along the line 6B—6B of FIG. 6A.

Then, n type impurities such as phosphorus or arsenic are implanted onto an inner surface of trench 15 by an ion implantation method, to form a first impurity layer 16. In this ion implantation, n type impurity ions are first directed vertically onto the surface of silicon substrate 11 at an implantation energy of 50 keV, and thereafter, the n type impurity ions are directed at an implantation energy of 400 keV onto the surface of silicon substrate 11 at an inclination of approximately 70° relative to a normal direction of the surface thereof. A thin dielectric film 17 of approximately 70 Å in thickness formed such as of a silicon nitride film or silicon oxide film is subsequently formed on the inner surface of trenches 15. In a method of formation of this dielectric film 17, preferably, after the silicon nitride film is deposited by the CVD method, a surface thereof is thermally oxidized, to form an $Si_3N_4/SiO_2$ layer. Then, a second conductor layer 18 made such as of polysilicon or the like and including n type impurities such as arsenic or phosphorus is deposited on a surface of dielectric film 17. In the formation of second conductor layer 18, a polysilicon layer of approximately 5000 Å in thickness is formed by the CVD method, so that polysilicon fills trenches 15 of approximately 0.8 $\mu$m in diameter. Then, dielectric film 17 and second conductor layer 18 are processed by dry etching or web etching, so that an exposed surface of dielectric film 17 and that of second conductor layer 18 are both located in and around the center of first insulator layer 12 in the direction of thickness thereof. Consequently, the resultant structure is shown in FIGS. 6A and 6B.

Figure 7A:
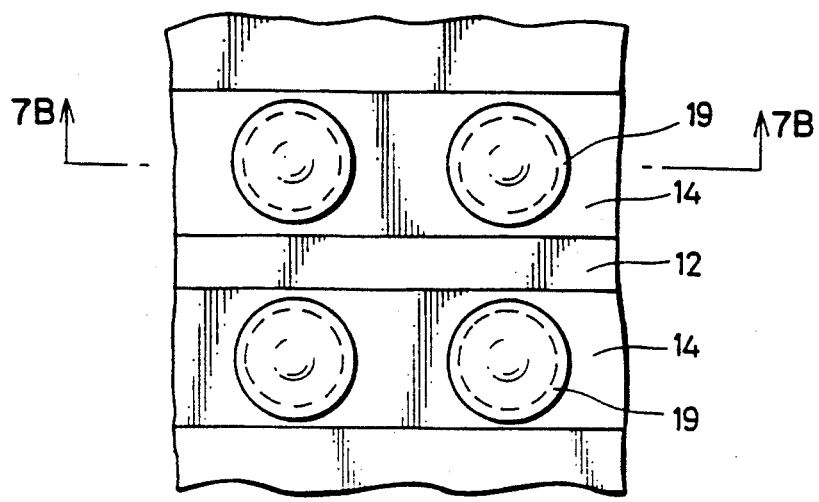
FIG. 7A is a plan view showing a fourth processing step of the principal manufacture process of the dynamic memory device according to the embodiment of the present invention.
Figure 7B:
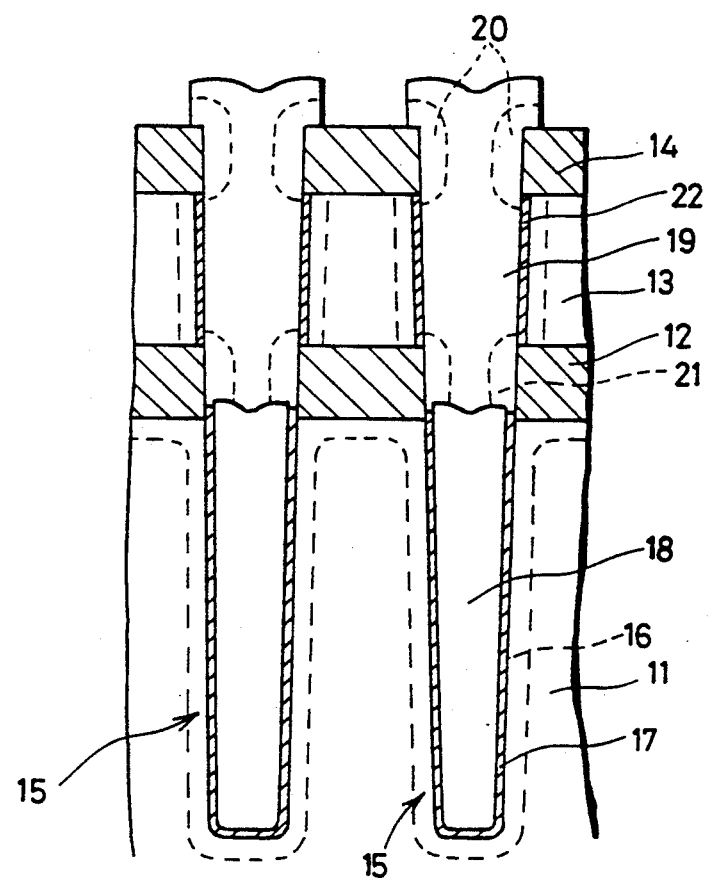
FIG. 7B is a cross-sectional view taken along the line 7B—7B of FIG. 7A.

Then, the inner circumferential surface of trenches 15 at the position of first conductor layer 13 is made to form a gate insulation film 22 made of a silicon oxide film having a thickness of approximately 100 Å–200 Å by a thermal oxidation method or the like. At this time, since the surface of second conductor layer 18 is also oxidized, this unrequired oxide film is selectively removed by dry etching. Thereafter, polysilicon or the like including p type impurities such as boron or the like is deposited to form an active layer 19. The formation of active layer 19 is carried out by deposition of a polysilicon layer having a thickness of approximately 5000 Å and including approximately $4\times10^{16}/cm^3$ of boron by employing the plasma CVD method or the like. Thus, the polysilicon fills trenches 15. A polysilicon layer formed on second insulator layer 14 is then subjected to photolithography by a photoresist and to dry etching. The processed polysilicon layer is then patterned in the form of covering an opening of trench 15. Then, a thermal processing causes n type impurities to be diffused into active layer 19 and silicon substrate 11, to form a drain region 20, a source region 21 and first impurity layer 16. The resultant structure is shown in FIGS. 7A and 7B. Since trenches 15 are semi-cylindrical holes, active layer 19 is formed in the shape of a frustum of a cone as shown in FIB. 7B. The thermal processing should be carried out in a nitrogen atmosphere at a temperature of 800°–900° C. for about 60 minutes.

Then, after a silicon oxide film, a silicon nitride film or the like are deposited by the plasma CVD method, a third insulator layer 23 is formed by dry etching so as to expose an upper end surface of active layer 19. Thereafter, titanium nitride, doped polysilicon or the like is deposited over the entire exposed surface by sputtering or the like. The resulting layer is then subjected to the photolithography by the photoresist and to the dry etching, to form a third conductor layer 24 serving as a bit line. Thus, the structure shown in FIGS. 2A and 2B is perfected.

In this embodiment, as described above, if active layer 19 is formed directly on a trench capacitor inside trench 15, a memory cell area can be made smaller as compared to the conventional case that an active layer is formed outside the trenches. That is, the memory cell area according to this embodiment is almost determined by the diameter of trenches 15 and the interconnection width of the bit line (third conductor layer 24). Therefore, when the diameter of trenches 15 is 0.8 $\mu$m, and the interconnection width of the bit line is 1.1 $\mu$m, the memory cell area is approximately 2.25 $\mu m^2$, and hence a higher integration can substantially be achieved as compared to the conventional example that requires the isolation between elements by the oxide film. (The memory cell area of this conventional case is approximately 5 $\mu m^2$.)

Figure 8A:
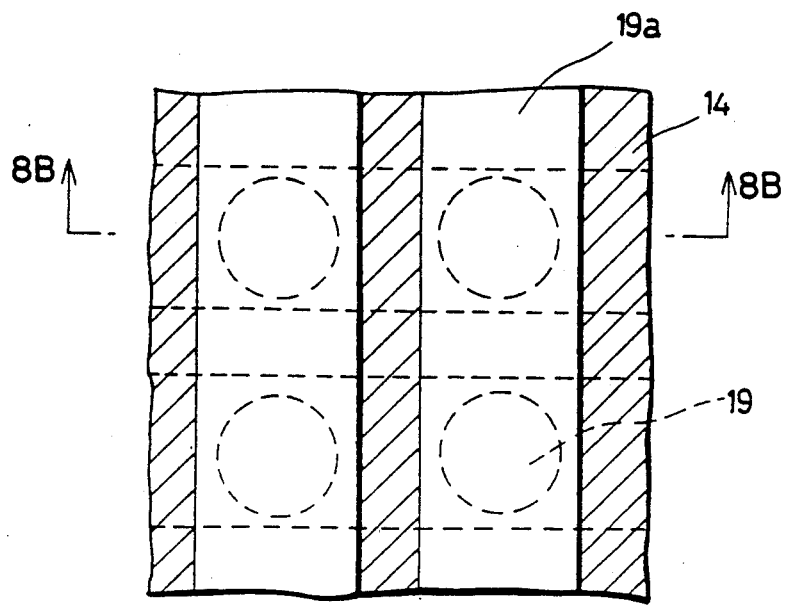
FIG. 8A is a plan view of a trench dynamic memory device according to another embodiment of the present invention.
Figure 8B:
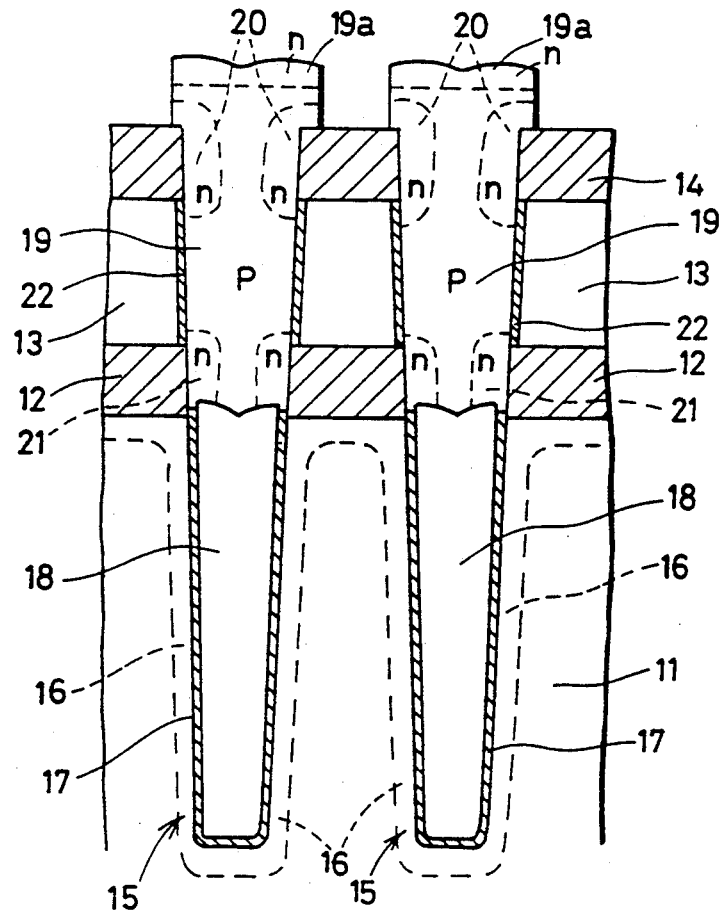
FIG. 8B is a cross-sectional view taken along the line 8B—8B of FIG. 8A.

While third conductor layer 24 is formed after third insulator layer 23 is formed to expose active layer 19 in the foregoing embodiment, it is also possible to pattern a polysilicon layer deposited on second insulator layer 14 upon formation of active layer 19 and to implant n type impurities such as phosphorus, so as to form a conductive interconnection layer 19a made of doped polysilicon and serving as a bit line as shown in FIGS. 8A and 8B.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a stacked layer including, stacked in the following order on a semiconductor substrate, a first insulator layer, a first conductor layer and a second insulator layer; and
   a trench formed to penetrate said first insulator layer, said first conductor layer and said second insulator layer and extend into said semiconductor substrate,
   said trench including a capacitor formed at a portion of said trench located in said semiconductor substrate, and a transistor formed directly on the capacitor,
   wherein said capacitor includes one electrode formed of said semiconductor substrate and the other electrode formed of a second conductor layer formed on a side surface and a bottom surface of said trench located in said semiconductor substrate, with a dielectric film interposed between the side and bottom surfaces of said second conductor layer and said semiconductor substrate; and
   said transistor includes a gate electrode formed of said first conductor layer, a gate insulation film formed of an insulator film formed on an inner circumferential surface of said trench located at the position of said first conductor layer, and a source region and a drain region formed in an active layer filling in said trench in the vicinity of said first insulator layer and said second insulator layer.

2. The semiconductor memory device according to claim 1, wherein
   said first conductor layer (13) comprises a polysilicon layer including n type impurities; said active layer (19) comprises polysilicon including p type impurities; and said drain and source regions (20 and 21) comprise diffused n type impurities.

3. The semiconductor memory device according to claim 1, wherein
   an upper portion of said active layer is deposited over an opening of said trench, and
   further comprising a third conductor layer formed to make contact with said upper portion of said active layer.

4. The semiconductor memory device according to claim 3, wherein
   said third conductor layer (19a) is formed by patterning a doped polysilicon layer piled on said active layer (19) and said second insulator layer (14) in a predetermined pattern.

5. The semiconductor memory device according to claim 3, wherein
   said third conductor layer (24) comprises a conductive metal layer patterned to cover the upper portion of said active layer (19) projecting upward above the opening of said trench (15).

6. The semiconductor memory device according to claim 1, wherein
   said second conductor layer (18) comprises polysilicon including a predetermined amount of impurities.

7. The semiconductor memory device according to claim 1, wherein
   said dielectric film (17) comprises a silicon nitride film and/or a silicon oxide film.

8. The semiconductor memory device according to claim 1, wherein
   said first insulator layer and said second insulator layer both include a predetermined amount of impurities having a conductivity type identical to a conductivity type of said drain region and said source region, and said source region is formed by diffusion of the impurities from said first insulator layer, and said drain region is formed by diffusion of the impurities from said second insulator layer.

* * * * *